United States Patent [19]

Cassarly et al.

[11] 4,433,886
[45] Feb. 28, 1984

[54] CONNECTOR MOUNTING FOR INTEGRATED CIRCUIT CHIP PACKAGES

[75] Inventors: James W. Cassarly; Robert W. Rollings, both of Huntingdon; Frank C. Youngfleish, Pennsylvania Furnace, all of Pa.

[73] Assignee: Elco Corporation, El Segundo, Calif.

[21] Appl. No.: 331,619

[22] Filed: Dec. 17, 1981

[51] Int. Cl.³ .................................... H01R 23/70
[52] U.S. Cl. ....................... 339/14 R; 339/17 CF; 339/75 MP; 339/176 MP
[58] Field of Search .......... 339/17 CF, 75 M, 75 MP, 339/176 M, 176 MP, 14 R

[56] References Cited

U.S. PATENT DOCUMENTS

| | | | |
|---|---|---|---|
| 3,883,207 | 5/1975 | Tomkiewicz | 339/75 M |
| 4,130,327 | 12/1978 | Spaulding | 339/17 CF |
| 4,278,311 | 7/1981 | Scheingold et al. | 339/17 CF |
| 4,340,266 | 7/1982 | Grovender | 339/17 CF |
| 4,341,433 | 7/1982 | Cherian et al. | 339/17 CF |
| 4,354,729 | 10/1982 | Grabbe et al. | 339/17 CF |

*Primary Examiner*—John McQuade
*Attorney, Agent, or Firm*—Body, Vickers & Daniels

[57] ABSTRACT

A connector mounting for an integrated circuit chip package having pad-type terminal contacts around its periphery, has a flat synthetic resin housing provided with a recess in its top side for receiving the chip package with its terminal contacts facing downwardly for electrical contact with laterally extending flexible spring contact arm portions of respective contact members mounted in the housing. An electrically conductive metal clamp or cover member is hingedly mounted on the housing to engage and press the chip package downwardly in the housing recess into contact member-engaging position therein. The contact members have rigid contact pin portions firmly anchored in the housing bottom and projecting perpendicularly downward therefrom in row alignment around the housing for plugging into a printed circuit board. The metal clamp member engages and presses down against ground contact means on the chip package to electrically connect and ground the chip package to a metal ground shield which encases the housing and with which the clamp member is engaged.

27 Claims, 5 Drawing Figures

CONNECTOR MOUNTING FOR INTEGRATED CIRCUIT CHIP PACKAGES

BACKGROUND OF THE INVENTION

This invention relates, in general, to a connector mounting for an integrated circuit chip package or similar device such as employed in the solid-state electronics field and having a terminal or substrate provided with circuit terminal contacts.

Certain types of integrated circuit chip packages in use at present have a substrate or terminal board provided with pad-type circuit contacts around the perimeter of the package substrate. One such chip package, designed for so-called large scale integration (LSI) and very large scale integration (VLSI) type integrated circuits, and commercially known as a 68 POS JEDEC TYPE "A" square package, has a substrate provided with 68 pad-type terminal contacts disposed around its perimeter.

The connector mountings heretofore provided for such type chip packages generally have been of relatively complicated and expensive construction. They have not been adapted for quick and easy assembly with the chip package. Many of the connectors have permanently captured the chip package. This made changing of a defective chip quite difficult if possible at all. Also, these prior connector mountings have not presented an appealing outward appearance.

SUMMARY OF THE INVENTION

The present invention contemplates a new and improved connector mounting for integrated circuit chip packages particularly of the LSI and VLSI type, which mounting overcomes the problems of prior art mountings and provides a connector mounting which is of appealing low-profile form and of simple and inexpensive construction and adapted for quick and easy assembly with, and removal and replacement of the chip package.

Briefly stated, in accordance with one aspect of the invention, a connector mounting for an integrated circuit chip package as referred to above is comprised of a relatively shallow, flat, synthetic resin housing having an upwardly opening recess in its top side within which the chip package is snugly received to properly position and orient it relative to the housing with its pad-type terminal contacts facing downwardly. The housing is provided with a plurality of electrical contact members mounted in and disposed around the housing and having respective flexible spring contact arm portions which project laterally inward into the housing recess for engagement and electrical contact with respective ones of the terminal contacts of the chip package. The contact members are formed with rigid contact pin portions which extend through and are firmly anchored in the housing bottom and project perpendicularly downward therefrom for plugging into a printed or other circuit board. An electrically conductive metal clamp or so-called cover member is snap-mounted on the housing to engage and press the chip package downwardly in the housing recess into contact member-engaging position therein. The clamp member is readily disengageable from the housing to permit quick and easy removal and replacement of a chip package having a defective chip, even after the assembled chip package and connector mounting have been mounted in place on a printed circuit panel.

According to a further aspect of the invention, the housing is provided with an encasing ground shield provided with one or more rigid contact pins projecting perpendicularly downward from the bottom of the connector mounting, and the metal clamp member is adpated to engage and electrically connect ground means on the chip package with the ground shield when the clamp member is in its clamping position.

According to a still further aspect of the invention, the housing is provided with a plurality of compartments disposed therearound within respective ones of which the contact members are located with their spring contact arm portions projecting laterally into the housing recess through window openings in the sidewalls of the recess.

The principal object of the invention is to provide a connector mounting for any size integrated circuit chip package for mounting on a printed circuit or other panel and which permits quick and easy assembly of the chip package with or removal from the connector mounting.

Another object of the invention is to provide a connector mounting for such chip packages which provides a ground or voltage connection as well as track connectors to the chip.

Still another object of the invention is to provide a connector mounting for such chip packages which effectively protects and supports the chip package in place therein and presents a pleasing overall appearance.

A further object of the invention is to provide a connector mounting for such chip packages which is of low profile form and has a snap-on clamp member for releasably holding the chip package in place within the mounting.

A still further object of the invention is to provide a connector mounting for such chip packages which permits quick and easy removal and replacement of the chip package even while the connector mounting and chip package assembly is mounted in place on a printed circuit panel.

Another object of the invention is to provide a connector mounting for LSI and VLSI chip packages having pad-type contacts on the package substrate.

Further objects and advantages of the invention will appear from the following description of a preferred species thereof taken in conjunction with the accompanying drawings.

DESCRIPTION OF THE PREFERRED EMBODIMENT

Figure 5:
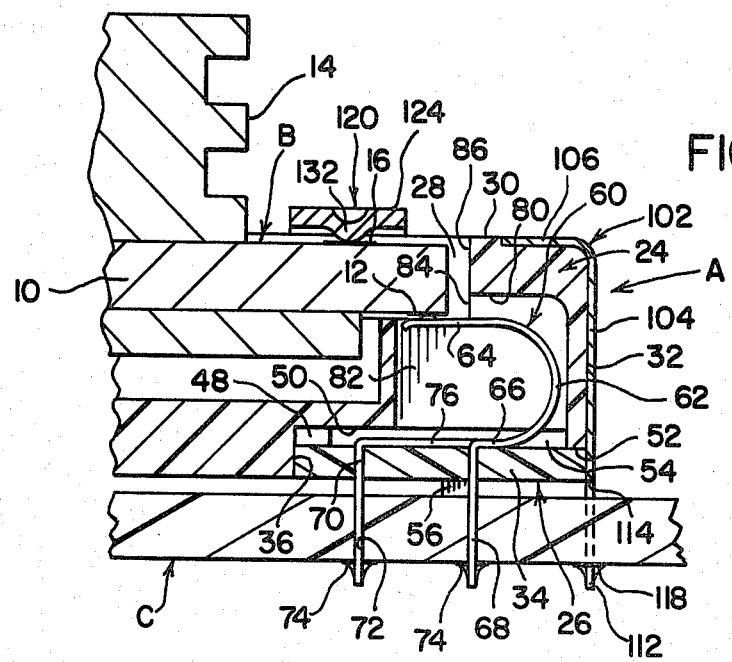

Referring to the drawings, wherein the showings are for the purposes of illustrating the preferred embodiment of the invention only and not for the purposes of limiting same, the figures show a connector mounting A for supporting an integrated circuit chip package B in place therein and adapted for mounting on a printed or other circuit panel or board C. The connector mounting A illustrated and described herein is particularly adapted for use with a known type of chip package B, designed for so-called large scale integration (LSI) and very large scale integration (VLSI) type integrated circuits, and commonly referred to as a 68 POS JEDEC TYPE "A" square package having 68 terminal contacts. It should be understood, however, that the connector mounting A may be employed as well for other similar type chip packages or devices. The chip package B forms no part of the present invention and is shown only in its basic exterior form. The particular chip package B illustrated is comprised, in general, of an integrated circuit chip (not shown) of LSI or VLSI form which is mounted internally of the package B on a substrate or terminal contact board 10 of quadrangular outer configuration, e.g., square shape as shown. The substrate 10 is provided on its bottom side with a plurality, i.e. 68, of pad-type electrical contacts or terminals 12 (FIG. 5) which are disposed in spaced apart relation around the peripheral extent of the substrate on its underside. The chip package is provided with a centrally located heat sink 14 upstanding from the upper side of the substrate 10 for drawing off and dissipating the heat generated within the chip package during operation. Electrically conductive grounding strips or pads 16 of suitable metallic material are provided on the upper side of the substrate 10 to enable grounding of the chip package B when assembled together with the connector mounting A.

The connector mounting A according to the invention comprises a two-part composite housing 20 made of a suitable indurated synthetic resin such as polyphenylene sulfide, for example, which has good thermal stability and is capable of withstanding high temperatures up to at least 105° C. Housing 20 is of quadrangular, e.g., square outer configuration generally corresponding to but of somewhat larger overall size than the outer configuration of the substrate 10 of chip package B. In the particular case illustrated wherein the connector mounting A is designed to accept and mount a 68 POS JEDEC TYPE "A" square chip package, the housing 20 may have its square-arranged outer sides each around 1.2 inches in length and a height dimension of slightly less than ¼ inches, e.g., around 7/32 inches high.

The composite housing 20 includes an upper or main housing member or section 24 and a lower section 26. The upper housing member 24 has an upwardly opening centrally located square-shaped recess 28 in its upper side 30 symmetrically oriented relative to the square-arranged outer sides 32 of the member 24 and of slightly larger size than the outer configuration of the substrate 10 of chip package B for receiving the latter therein. The lower section 26 of housing 20 is composed of four similar plate-like members 34 of elongated form fitted in and fixedly secured within a channel-shaped recess 36 in the underside of housing member 24 which recess extends therearound, in a corresponding square-shaped configuration, parallel to and adjacent the four outer sides 32 of the upper housing member. The plate members 34 may be secured in place in the channel-shaped recess 36 in any suitable manner, as by being press-fitted therein or by a suitable bonding medium.

The four plate-like lower housing sections 34 may have a thickness of around 3/64 inches or so and a width of around ¼ inches, and they are each formed with respective 45° angled ends 38, 40 which abut the corresponding angled ends 38, 40 of the next adjacent plate members 34 when fitted in place within the channel recess 36. The angled end 38 at one end of each plate member 34 terminates at its outward end in a flat transverse end land surface 42 while the angled other end 40 is formed at its outward end with a small lug projection 44 providing a corresponding flat longitudinal end land surface 46 for abutting engagement with flat land surface 42 of the adjacent plate member, thereby providing interfitted end joints between the adjacent plate members. The plate members 34 are each formed with a plurality (e.g., three) of relatively short, equal height spacer blocks or pads 48 upstanding from the upper sides of the plate members and spaced apart along their inward side edges. The spacer pads 48 abut against the base wall 50 of the channel recess 36, and the plate members 34 abut along their outward sides against the bottom edges 52 of the housing member 24, to thereby space the plate members 34 from the base wall 50 and provide a shallow passageway 54 therebetween. The upper housing member 24 is formed on its bottom side, at each of its four corners, with depending seating posts 56 for seating against the printed circuit board C when the assembly of the connector mounting A and chip package B is plugged thereinto and mounted in place thereon.

Figure 4:
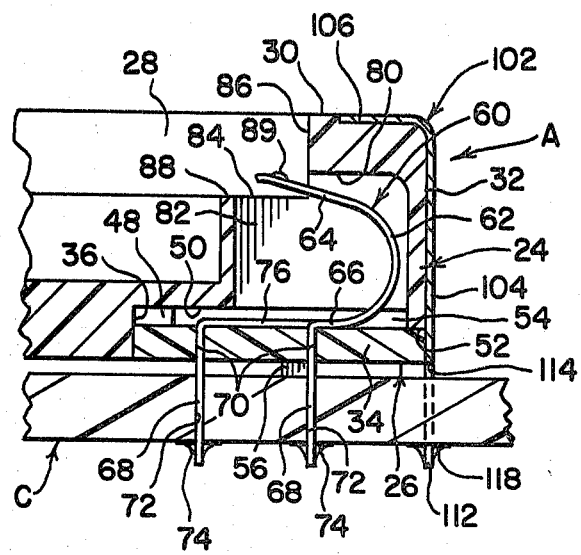
FIG. 4 is a vertical section of the connector mounting on the line 4—4 of FIG. 1; and, FIG. 5 is a vertical section of the assembled connector mounting, chip package and printed circuit board taken on the line 5—5 of FIG. 3.

Mounted within the housing 20 around the four side regions thereof and distributed in equal numbers along each of such side regions, are a plurality of elongated contact members 60 corresponding in number to the number, i.e., 68 in the particular case illustrated, of contact terminals 12 on the chip package B. The contact members 60 are preferably formed of a suitable relatively rigid wire rod or bar material, such as a copper alloy, having a rectangular cross-section, e.g., 0.008"×0.021". As shown in FIG. 4, the elongated contact members 60 are each formed with a hairpin bent loop portion 62 providing a flexible free end or spring contact arm portion 64 and a medial support arm portion 66 from which a rigid contact pin or tail portion 68 extends outwardly at a right angle and parallel to the plane of the two arm portions 64, 66 of the hairpin loop portion 62.

The contact pin or tail portions 68 of the contact members 60 are force fitted into and extend through respective apertures 70 in the lower housing sections 34, with their medial support arm portions 66 resting against the housing sections 34, to thereby firmly anchor and mount the contact members in place in the housing sections and in housing 20 in spaced side-by-side relation on the respective housing sections. In this anchored position, the contact pin portions 68 of the contact members 60 project perpendicularly downward from the bottom side of the housing 20, and the flexible spring contact arm portions 64 extend laterally inward of the housing into the recess 28 in the upper housing member 24. The contact pin receiving apertures 70 in each of the elongated lower housing sections 34 are arranged side-by-side in two spaced parallel rows therealong so that the contact pin portions 68 project downwardly from the housing 20 in double row alignment adjacent respective outer sides 32 of the housing 20 in a square-shaped pattern therearound, with the contact pins in one row disposed side-by-side with respective pins in the other row, for plugging into respective contact pin receiving apertures 72 in the circuit board C which are likewise arranged in a double row square pattern therein and are provided with contact pin engaging electrical contacts 74 on the underside of the board C. To this end, the medial support arm portions 66 of alternate ones of the contact members 60 mounted along each side of the housing 20 are made of longer length than the others and are angled sideways, as indicated at 76, in order to offset their contact pin portions 68 the necessary amount to enable their insertion in the apertures 70 of the innermost row thereof in each lower housing section 26. Preferably, at least those portions of the contact pins 68 which electrically connect with the circuit board contacts 74 are provided with a solder plating.

The hairpin bent loop portions 62 and laterally inward extending spring contact arm portions 64 of the contact members 60 are snugly received or housed within respective vertically disposed slot-shaped compartments 80 which are formed in the upper housing member 24 by divider walls 82 thereof and which open downwardly into the channel recess 36 as well as upwardly and laterally inwardly into the upper recess 28 of the housing member 20 at window openings 84 in the vertical sidewalls 86 and bottom wall 88 of the housing recess 28. The medial support arm portions 66 of the contact members 60, including those medial arm portions 66 which are of extended length and are angled sideways and thus underlie the base wall 50 of the channel recess 36, are accommodated within the aforementioned passageway 54 formed between the base wall 50 of the channel recess 36 in the upper housing member 24 and the upper side of the lower housing members 34. The slot-shaped compartments 80 are of a width such as to closely confine the contact arm portions 64 of the contact members 60 between the divider walls 82 of the housing member 24 which form and separate the compartments 80 from one another. The contact arm portions 64 of the contact members 60 located along each respective sidewall 86 of the recess 28 are thereby properly oriented and maintained in parallel side-by-side relation extending laterally into the recess 28 and electrically insulated from one another, and are prevented from lateral wiggling movement or sidewise displacement in the housing 20. In their unflexed condition as shown in FIG. 4, the flexible spring contact arm portions 64 of the contact members 60 extend at a slight upward angle in the housing compartments 80 and into the housing recess 28 so as to permit downward flexure movement of the contact arm portions 64 when engaged and pressed down by the terminal contacts 12 of the chip package B when inserted into the housing recess 28 and pressed downwardly therein. The free ends of the spring contact arm portions 64 exposed within the recess 28 are formed with upwardly protruding pimple-like indents or pustules 89 for making positive electrical contact with the pad-type terminal contacts 12 of the chip package B. The indents or pustules 89 are preferably provided with a gold plating over a nickel uderplating to afford a better electrical contact surface thereon.

Figure 1:
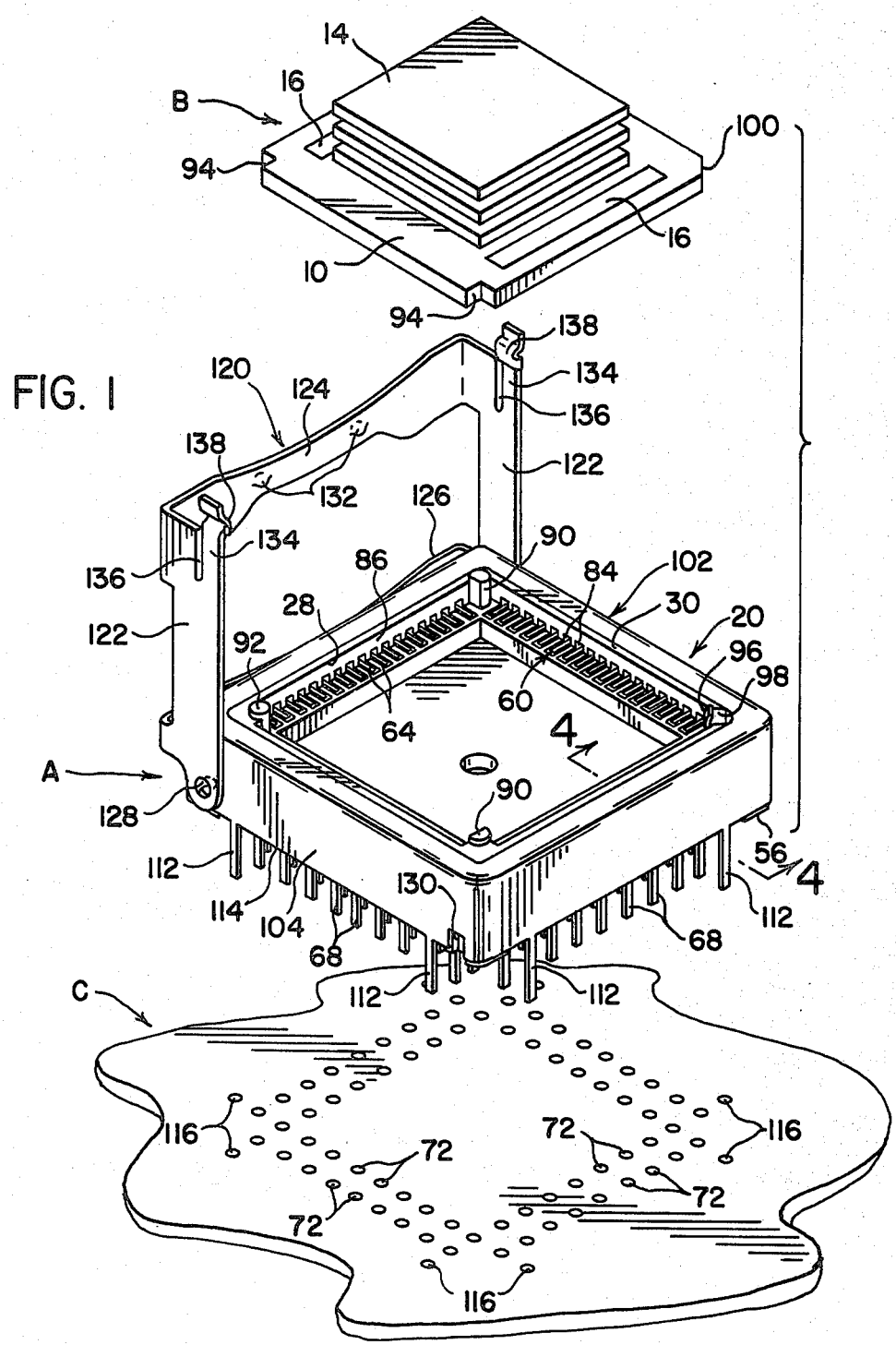
FIG. 1 is an exploded perspective view of the connector mounting comprising the invention shown in association with an integrated circuit chip package for mounting therein and with a printed circuit board on which the asembled connector mounting and chip package are adapted to be mounted.
Figure 2:
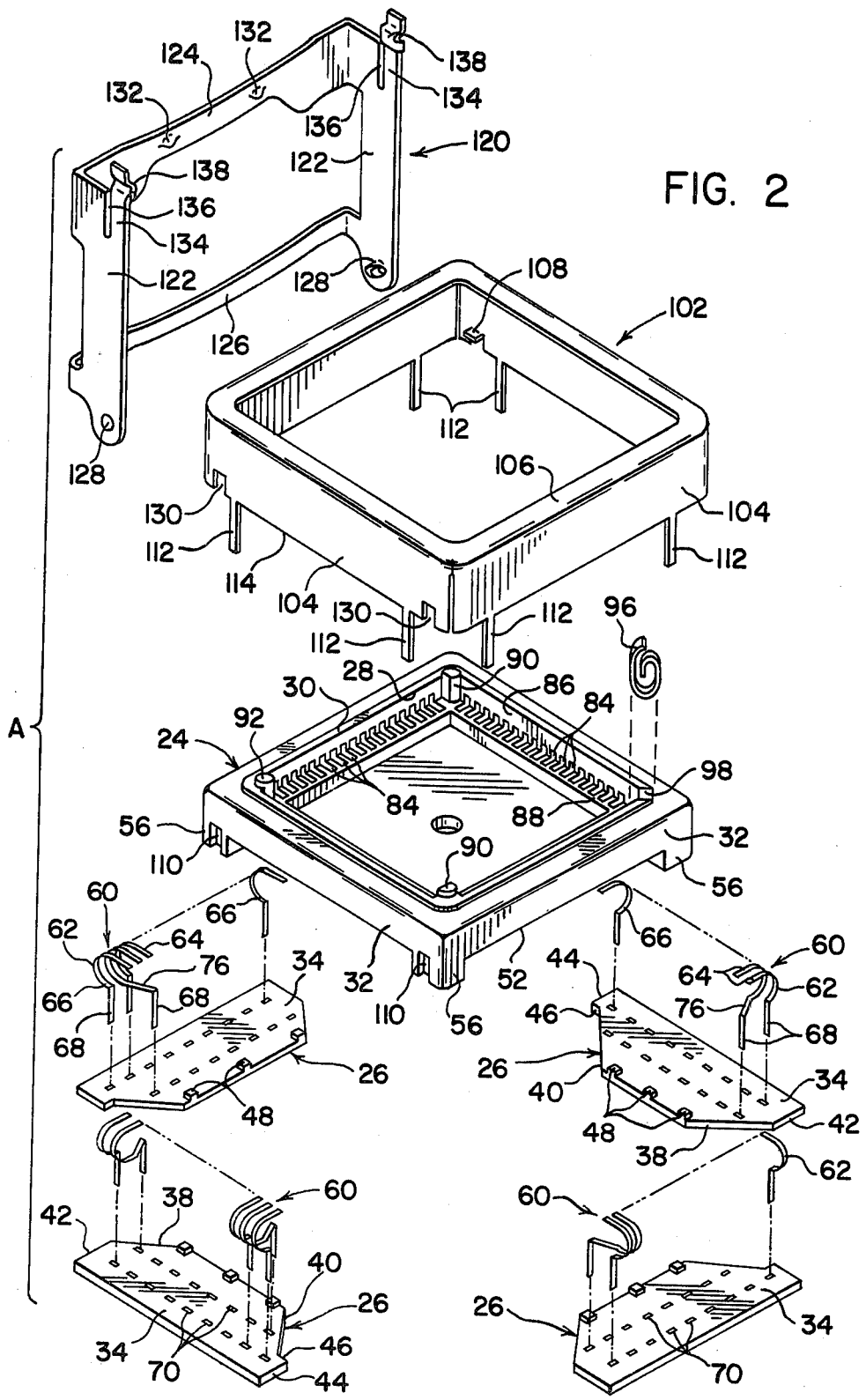
FIG. 2 is an exploded perspective view of the connector mounting comprising the invention showing the various individual components thereof in detail.
Figure 3:
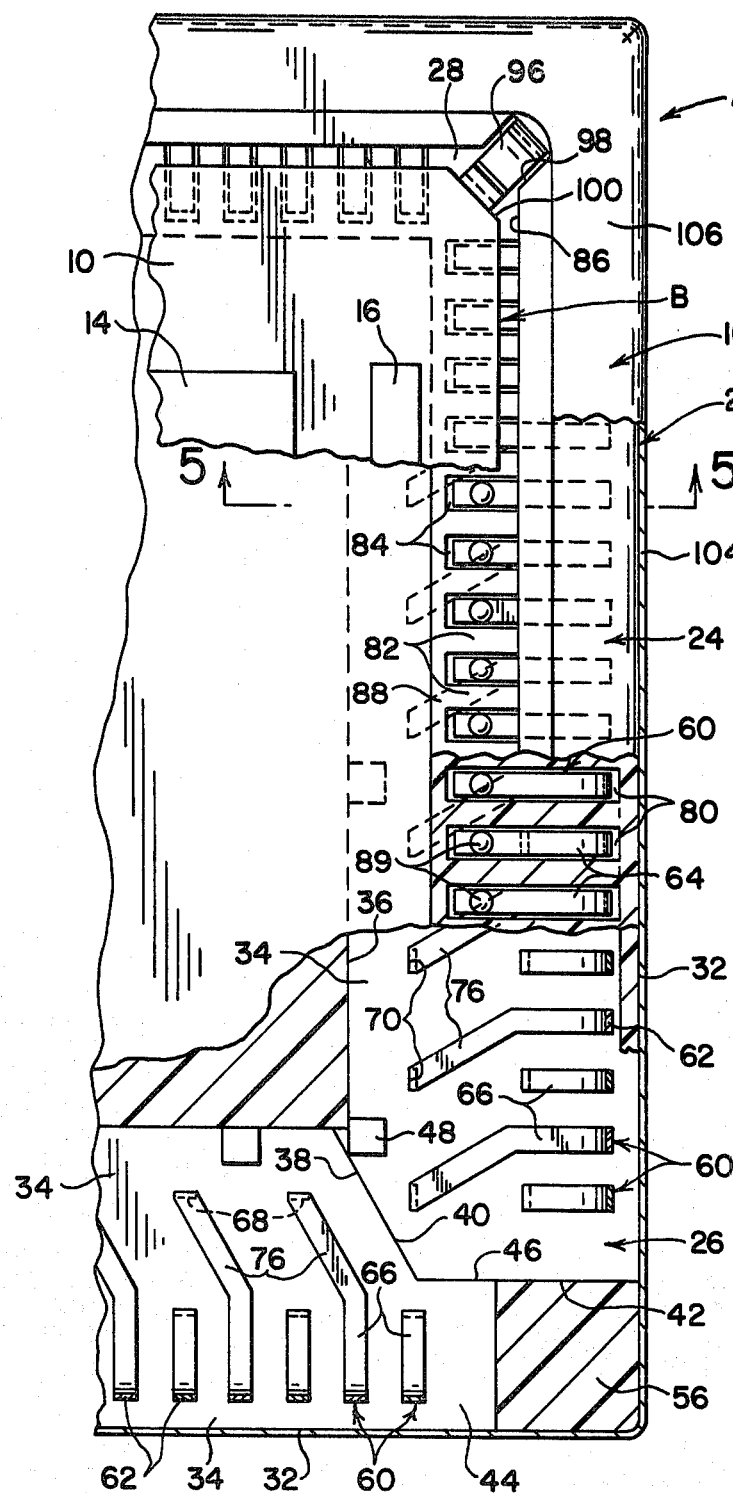
FIG. 3 is a top elevational view of the assembled connector mounting comprising the invention and the chip package, shown partly broken away and in section to reveal the inner details of the connector mounting.

The upper housing member 24 is provided with chip package orienting bosses 90 and 92 (FIG. 1) located at three of the corners of the square-shaped upper recess 28 therein, for engaging within notches 94 in three of the corners of the square-shaped chip package substrate 10 in order to thereby properly orient the chip package B in the recess 28 relative to the connector mounting A and its contact members 60. In addition, the upper housing member 24 is provided with a biasing spring clip 96 anchored within a vertical slot 98 formed in the fourth corner of the housing recess 28 for engaging with a 45° beveled fourth corner 100 on the chip package substrate 10 to thereby bias the substrate laterally against the orienting and locating bosses 90, 92 so as to locate the chip package B in proper centered position within the recess 28 of housing member 24.

A ground shield 102 formed of a suitable electrically conductive metal sheet material such as tin-plated sheet steel and shaped in the form of a four-sided frame having sidewalls 104 and an inturned top wall 106, is preferably mounted on the housing 20 to substantially encase the upper housing member 24 except for the bottom and the upper recess 28 thereof. The ground shield is secured in place on the housing member by means of a plurality of inturned locking tongues or tabs 108, two on each of two opposite sidewalls 104 of the shield, which are pressed out of the sidewalls and extend into and engage the closed upper ends of notches 110 formed in two opposite outer sides 32 of the housing member 24. The ground shield 102 is formed with a plurality of rigid ground contact pins 112 similar in form to the contact pin portions 68 of contact members 60 and extending perpendicularly downward from the bottom edge 114 of the ground shield in parallel relation to one another and to the contact pins 68. Two of such rigid ground contact pins 112 are provided on the ground shield 102 adjacent and on opposite sides of each of the four corners of the ground shield, for plugging into respective ground contact pin receiving apertures 116 in the printed circuit board C which are provided with ground contact pin engaging electrical contacts 118 on the underside of the board C. The ground contact pins 112 also may be provided with a solder plating on those portions thereof which electrically connect with the circuit board ground contacts 118.

A snap-on clamp or cover member 120 formed of a suitable electrically conductive metal sheet material such as tin-plated sheet steel, is hingedly mounted on and clampable to the housing 20 to engage a chip package B inserted in the recess 28 of housing 24 to press it downwardly so as to cause the terminal contacts 12 of the chip package to engage and deflect, and make electrical contact with, the exposed ends of the spring contact arm portions 64 of respective contact members 60. The clamp member 120 is of a saddle-like frame form comprised of a pair of parallel extending, spaced apart, elongated sidewall members 122 joined together at their top edges by a pair of parallel, spaced apart, transverse tie strap members 124, 126 which extend perpendicularly to the sidewall members 122 and are adapted to overlie and straddle the recess 28 of housing member 24 when the clamp member is mounted on and snap-locked in closed position thereon. Sidewall members 122 are of a length and height more or less corresponding to the sidewalls 104 of the ground shield 102, and they are spaced apart by their connecting tie strap members 124, 126 a distance such as to fit closely over and alongside the two opposite sidewalls 104 of the shield member formed with the inturned locking tongues 108, when the clamp member 120 is mounted in place on the housing 20 and its encasing ground shield 102 and snap-locked in its closed position thereon.

The sidewall members 122 of clamp member 120 are formed adjacent one end with opposed inturned pivot trunnions 128 pressed out of the sidewall members and having a generally semi-cylindrical or inverted U-shaped cross-section for insertion into the open bottom ends of and accommodation within two opposed ones of the notches 110 in housing member 24 as well as in two opposed ones of the slot-shaped recesses 130 that are formed in the ground shield by the pressing out of the locking tabs 108 and that are aligned with the trunnion-receiving notches 110. The trunnions 128 engage and pivotally bear against the locking tabs 108 of the ground shield 102 to electrically engage therewith and permit pivoting of the clamp member 120 on the housing 20 to its closed snap-locked position thereon to clamp the chip package B in the recess 28 of the housing. The tie strap member 124 is formed with a spaced pair of downwardly protruding pimple-like indents or pustules 132 constituting ground contacts for engaging and making good electrical contact with the ground pads 16 on the chip package substrate 10 when the clamp member 120 is snap-locked in its closed position on housing 20. The indents or pustules 132 may be provided, if desired, with a gold plating over a nickel underplating to provide a better electrical contact surface. It will be understood that the tie strap 126 at the hinged end of the clamp member 120 must be spaced radially from the pivot axis of the trunnions 128 a sufficient distance to clear the sidewall 104 and top wall 106 of the ground shield 102 at the hinged end of the clamp member, when the latter is pivoted to its closed position on the housing 20.

The clamp member 120 is provided with a pair of flexible spring locking fingers 134 respectively located at the ends of the sidewall members 122 opposite their hinged ends. The spring locking fingers 134 are formed by providing each of the sidewall members 122 with a longitudinal slot 136 extending some distance inwardly from the ends of the sidewall members opposite their hinged ends. Locking fingers 134 are formed adjacent their free ends with inwardly offset detents or projections 138 constituting catch means for snap-locking both into respective ones of the notches 110 of housing member 24 and into those slot-shaped recesses 130 of ground shield 102 that are aligned therewith, to thereby lock the hinged clamp member down in its closed position on the housing 20 against the upward unclamping force exerted by the deflected spring contact arm portions 64 of contact members 60 against the chip package B. The snap-locked clamp member 120 may be released to permit pivotal movement thereof to its open position for quick and easy removal and replacement of the chip package B, simply by grasping the free ends of the spring locking fingers 134 and springing them outwardly to disengage their locking detents 138 from within the aligned notches 110 and recesses 130.

In the use of the connector mounting A comprising the invention to support and mount an integrated circuit chip package B for mounting on, and electrical connection thereof to the circuits of a printed or other circuit board C, the chip package B is simply inserted into the open top recess 28 of the housing 20 in proper oriented position therein, as determined by the cooperating orienting bosses 90, 92 in the recess 28 and corner notches 94 of the chip package substrate 10. Thereupon, the pivot trunnions 128 of clamp member 120 are inserted into the appropriate notches 110 of housing member 24 and slot-shaped recesses 130 of ground shield 102, and the clamp member then pivoted down over the top of the housing 20 until the detents 138 on spring locking fingers 134 snap into and catch in the notches 110 of housing member 24 and slot-shaped recesses 130 of ground shield 102. The housing 20 and clamp member 120 thus become locked together as a unitary assembly with the chip package B, with the terminal contacts 12 on the chip package substrate 10 pressed down against and flexing the spring contact arm portions 64 of respective ones of the contact members 60 so as to form a good electrical contact therewith. At the same time, the ground contact indents 132 on the tie strap 124 of clamp member 120 are pressed down into good electrical contact with one of the ground pads 16 of the chip package B to thereby ground the chip package to the ground shield 102. The completed assembly of the connector mounting A and the chip package B then can be plugged into the printed circuit board C and the contact pins 68 and 112 electrically connected to the electrical contacts 74 and 118 of the circuit board C.

When the completed assembly of the connector mounting A and chip package B is thus plugged into and electrically connected to the circuit board C, the contact members 60 of the connector mounting A then serve as tracking connectors to electrically connect the terminal contacts 12 of the chip package B to respective ones of the electrical circuits on the printed circuit board C. At the same time, the ground contact pins 112 of the connector mounting A are electrically connected with the ground circuit on the printed circuit board C to thereby effectively ground the chip package B.

To remove the chip package B from the connector mounting A as, for instance, where it is desired to replace a package having a defective chip, it is merely necessary to flex the spring locking fingers 134 of the clamp member 120 outwardly to disengage and release their locking detents 138 from within the housing notches 110 and ground shield recesses 130, whereupon the clamp member 120 can be swung upwardly relative to the housing 20 to uncover the housing recess 28 and the chip package B therein for easy removal of the chip package from the connector mounting A. A replacement chip package B then can be inserted and clamped in place in the connector mounting A while the latter remains mounted in place on the circuit panel C.

Thus having described the invention, the following is claimed:

1. A connector mounting for an integrated circuit chip package having a plurality of electrical circuit contacts around the periphery of the underside of the terminal board thereof and a centrally located heat sink mounted on and upstanding from the upper side of the terminal board and overlying a substantial portion of the surface area thereof, said mounting comprising a plastic housing having an upwardly opening housing recess in its upper side defined by vertical inner side walls of said housing and a horizontal bottom wall, said recess conforming to the outer configuration of said terminal board and adapted to receive and position said chip package in said recess with its said circuit contacts facing downwardly, a plurality of electrical contact members secured in said housing within respective cavities therein and having flexible spring contact arm portions extending laterally inward through window openings in said housing recess side walls and into and exposed within the housing recess, said contact members also having rigid contact pin portions projecting downwardly in parallel relation from the bottom side of said housing, and a clamp member mounted on said housing and engaging and clamping said chip package in said housing recess with the said circuit contacts of said package pressed against and in electrical contact with the said spring contact arm portions of respective ones of said contact members, said clamp member comprising a frame member including a pair of elongated parallel side wall members joined together approximately at their opposite ends by a pair of parallel narrow transverse tie strap members, said side wall members being located entirely outward of said housing and extending closely alongside opposite outer sides thereof and defining with said tie strap members an unobstructed opening therebetween exposing substantially the entire upper side of said chip package, except for the relatively narrow band portions thereof covered at the opposite ends of the chip package by the said tie strap members, for the accommodation within said opening of the said upstanding heat sink on said chip package.

2. A connector mounting as specified in claim 1 wherein the said housing is of quadrangular exterior configuration and the said housing recess is of corresponding quadrangular configuration and is symmetrically oriented and positioned relative to the quadrangular exterior configuration of said housing.

3. A connector mounting as specified in claim 2 wherein the said housing and the said housing recess are of square configuration.

4. A connector mounting as specified in claim 1 wherein the said rigid contact pin portions of said contact members project perpendicularly from the bottom side of said housing in row alignment with one another.

5. A connector mounting as specified in claim 1 wherein the said rigid contact pin portions of said contact members project perpendicularly from the bottom side of said housing in double row alignment with one another around the said housing.

6. A connector mounting as specified in claim 1 wherein the said rigid contact pin portions of said contact members are closely fitted within respective apertures in the bottom portion of said housing to secure the said contact members in place of said housing.

7. A connector mounting as specified in claim 1 wherein the said contact members are located and confined within respective individual compartments in said housing spaced apart by divider wall portions of said housing and are separated and electrically insulated from one another by the said divider wall portions.

8. A connector mounting as specified in claim 1 wherein the said housing is provided with orienting shoulder means within said housing recess engageable with the said terminal board of said chip package to locate the latter in a predetermined oriented position within said housing recess.

9. A connector mounting as specified in claim 1 wherein the said clamp member is hingedly mountable at one end of said housing for pivotal movement relative thereto and is provided with catch means at its other end for locking engagement with said housing to hold the said clamp member in a closed position relative thereto with the clamp member engaging and clamping the said chip package in place in said housing recess.

10. A connector member as specified in claim 9 wherein the said catch means on said clamp member comprises flexible spring finger means for snap locking into locking notch means in said housing to hold the said clamp member in its said closed clamping position.

11. A connector mounting as specified in claim 9 wherein the said housing is provided with a pair of pivot bearing recesses and a pair of locking notches both located in the same opposite pair of side walls of said housing for respectively receiving pivot trunnions on said clamp member and the said catch means thereon.

12. A connector mounting as specified in claim 11 wherein the top and outer sides of said housing are encased by a metal ground shield, and said clamp member comprises a metal frame formed on its opposite sides with the said pivot trunnions and with the said catch means, said ground shield being also provided with a pair of pivot bearing recesses and a pair of locking notches corresponding to and respectively laterally aligned with the said pivot bearing recesses and locking notches in said upper housing member for also respectively receiving the said pivot trunnions and catch means.

13. A connector mounting for an integrated circuit chip package having a plurality of electrical circuit contacts around the periphery of the terminal board thereof, said mounting comprising a plastic housing having an upwardly opening housing recess in its upper side, said recess conforming to the outer configuration of said terminal board and adapted to receive and position said chip package in said recess with its said circuit contacts facing downwardly, a plurality of electrical contact members secured in said housing and having flexible spring contact arm portions extending laterally inward into and exposed within the housing recess, said contact members also having rigid contact pin portions projecting downwardly in parallel relation from the bottom side of said housing, and a clamp member mounted on said housing and engaging and clamping said chip package in said housing recess with the said circuit contacts of said package pressed against and in electrical contact with the said spring contact arm portions of respective ones of said contact members, the top and outer sides of said housing being encased by a metal ground shield, and said clamp member comprising a metal frame electrically engaging with said metal ground shield and with ground contact means on said chip package when said clamp member is in its closed clamping position.

14. A connector mounting as specified in claim 13 wherein the said ground shield is provided with a plurality of rigid ground contact pins projecting downwardly therefrom in parallel relation to the said contact pin portions of said contact members.

15. A connector mounting as specified in claim 13 wherein the said clamp member comprises a saddle-like frame member including a pair of parallel extending spaced side wall members joined together by a pair of parallel spaced-apart transverse tie strap members, one of said tie strap members having at least one ground contact indent for engaging with ground contact means on said chip package.

16. A connector mounting for an integrated circuit chip package having a plurality of electrical circuit contacts around the periphery of the terminal board thereof, said mounting comprising a plastic housing having an upwardly opening housing recess in its upper side, said recess conforming to the outer configuration of said terminal board and adapted to receive and position said chip package in said recess with its said circuit contacts facing downwardly, a plurality of electrical contact members secured in said housing and having flexible spring contact arm portions extending laterally inward into and exposed within the said housing recess, said contact members also having rigid contact pin portions projecting downwardly in parallel relation from the bottom side of said housing, and a clamp member mounted on said housing and engaging and clamping said chip package in said housing recess with the said circuit contacts of said package pressed against and in electrical contact with the said spring contact arm portions of respective ones of said contact members, said clamp member being hingedly mountable at one end on said housing for pivotal movement relative thereto and being provided with catch means at its other end for locking engagement with said housing to hold the said clamp member in a closed position relative thereto with the clamp member engaging and clamping the said chip package in place in said housing recess, said housing being provided with a pair of pivot bearing recesses and a pair of locking notches both located in an opposite pair of side walls of said housing for respectively receiving pivot trunnions on said clamp member and the said catch means thereon, and the top and outer sides of said housing being encased by a metal ground shield and said clamp member comprising a metal frame formed on its opposite sides with the said pivot trunnions and with the said catch means, said ground shield being provided with inturned tongues bent into the said pivot bearing recesses and locking notches in said housing to secure the said ground shield in place thereon.

17. A connector mounting for an integrated circuit chip package having a plurality of electrical circuit contacts around the periphery of the terminal board thereof, said mounting comprising a two-part housing of a thermoplastic synthetic resin material including a quadrangular-shaped upper housing member having a downwardly-opening shallow channel-shaped bottom recess disposed around the bottom side thereof and lower housing means within and closing said bottom recess and secured to said upper housing member, said upper housing member having an upwardly-opening upper recess in its upper side defined by vertical inner side walls of said housing member and having a bottom wall, said upper recess conforming to the outer configuration of said terminal board to receive and position the said chip package therein with its said circuit contacts facing downwardly, said upper housing member having a plurality of slot-shaped compartments therearound opening laterally into the said upper recess through window openings in the said vertical side and bottom walls thereof and also opening downwardly into said bottom recess, a plurality of electrical contact members disposed in respective ones of said housing compartments and in side-by-side relation and having rigid contact pin portions extending downwardly through and firmly anchored in said lower housing means and projecting perpendicularly downward from the bottom side of said housing in parallel relation to one another, said contact members further having flexible spring contact arm portions extending laterally in side-by-side relation within the said compartments and through the said window openings in the said side walls of said upper recess into and exposed within the said upper recess for spring contact engagement with the said circuit contacts on the terminal board of said chip package, and a clamp member mounted on said upper housing member and engaging and clamping the said chip package in place in said housing upper recess in contact member-engaging position therein with the said circuit contacts pressed against and in electrical contact with the spring contact arm portions of respective ones of said contact members, and said lower housing means comprising a plurality of elongated thin plate-shaped members tightly fitted in and closing said bottom recess and lying substantially flush with the bottom side of said upper housing member and firmly secured thereto, said plate-shaped members abutting and interengaging one another at their adjacent ends to extend continuously around the said channel-shaped bottom recess.

18. A connector mounting as specified in claim 17 wherein the said rigid contact pin portions of said contact members project from the bottom side of said housing in row alignment with one another.

19. A connector mounting as specified in claim 17 wherein the said housing is of square exterior configuration and the said upper recess is of corresponding square configuration and symmetrically oriented and located relative to the square exterior configuration of said housing, and the said rigid contact pin portions of said contact members project from the bottom side of said housing in a corresponding square-configurated row alignment pattern symmetrically oriented and located relative to the square exterior configuration of said housing.

20. A connector mounting as specified in claim 19 wherein the said contact pin portions of said contact members are secured within and extend through respective contact pin receiving apertures located in said plate-shaped lower housing members and arranged in side-by-side double row alignment therealong, and project from the bottom side of said housing in a corresponding side-by-side double row alignment with one another and in a square pattern therearound corresponding to the square exterior configuration of said housing, said contact members having medial arm portions engaging said plate-shaped lower housing members, the said medial arm portions of alternate ones of said side-by-side contact members secured in each of said plate-shaped lower housing members being of longer length than the others and being laterally angled to one side to locate their contact pin portions in respective ones of said apertures in the innermost row thereof.

21. A connector mounting as specified in claim 17 wherein the said clamp member is hingedly mountable at one end on said housing for pivotal movement relative thereto and is provided with catch means at its other end for locking engagement with said housing to hold the said clamp means in a closed position relative thereto with the clamp means engaging and clamping the said package in place in said housing upper recess in the said contact member-engaging position therein.

22. A connector mounting as specified in claim 21 wherein the said catch means on said clamp member comprises flexible spring finger means for snap locking into locking notch means in said upper housing member to hold the said clamp member in its said closed clamping position.

23. A connector mounting as specified in claim 21 wherein the said upper housing member is provided with a pair of pivot bearing recesses and a pair of locking notches both located in the same opposite pair of side walls of said upper housing member for respectively receiving pivot trunnions on said clamp member and the said catch means thereon.

24. A connector mounting as specified in claim 23 wherein the top and outer sides of said housing are encased by a metal ground shield, and said clamp member comprises a metal frame formed on its opposite sides with the said pivot trunnions and with the said catch means, said ground shield being also provided with a pair of pivot bearing recesses and a pair of locking notches corresponding to and respectively laterally aligned with the said pivot bearing recesses and locking notches in said upper housing member for also respectively receiving the said pivot trunnions and catch means thereon.

25. A connector mounting as specified in claim 17 wherein the said plate-shaped members comprising said lower housing means are formed at their opposite ends with shouldered end surfaces mating and interfitting with one another at the junctions between adjacent ones of said plate-shaped members to position and hold them in proper place within said channel-shaped bottom recess.

26. A connector mounting for an integrated circuit chip package having a plurality of electrical circuit contacts around the periphery of the terminal board thereof, said mounting comprising a two-part housing of a thermoplastic synthetic resin material including a quadrangular-shaped upper housing member having downwardly-opening bottom recess means disposed around the bottom side thereof and lower housing means fitted in and closing said bottom recess means and secured to said upper housing member, said upper housing member having an upwardly-opening upper recess in its upper side defined by vertical inner walls of said housing member and having a bottom wall, said upper recess conforming to the outer configuration of said terminal board to receive and position the said chip package therein with its said circuit contacts facing downwardly, said upper housing member having a plurality of slot-shaped compartments therearound opening laterally into the said upper recess through the said vertical and bottom walls thereof and also opening downwardly into said bottom recess means, a plurality of electrical contact members disposed in respective ones of said housing compartments and in side-by-side relation and having rigid contact pin portions extending downwardly through and firmly anchored in said lower housing means and projecting perpendicularly downward from the bottom side of said housing in parallel relation to one another, said contact members further having flexible spring contact arm portions extending laterally in side-by-side relation into and exposed within the said upper recess of said upper housing member for spring contact engagement with the said circuit contacts on the terminal board of said chip package, and a clamp member mounted on said upper housing member and engaging and clamping the said chip package in place in said housing upper recess in contact member-engaging position therein with the said circuit contacts pressed against and in electrical contact with the spring contact arm portions of respective ones of said contact members, the top and outer sides of said upper housing member being encased by a metal ground shield, and said clamp member comprising a metal frame electrically engaging with said metal ground shield and with ground contact means on said chip package when said clamp member is in its closed chip package clamping position.

27. A connector mounting for an integrated circuit chip package having a plurality of electrical circuit contacts around the periphery of the terminal board thereof, said mounting comprising a two-part housing of a thermoplastic synthetic resin material including a quadrangular-shaped upper housing member having downwardly-opening bottom recess means disposed around the bottom side thereof and lower housing means fitted in and closing said bottom recess means and secured to said upper housing member, said upper housing member having an upwardly-opening upper recess in its upper side defined by vertical inner walls of said housing member and having a bottom wall, said upper recess conforming to the outer configuration of said terminal board to receive and position the said chip package therein with its said circuit contacts facing downwardly, said upper housing member having a plurality of slot-shaped compartments therearound opening laterally into the said upper recess through the said vertical and bottom walls thereof and also opening downwardly into said bottom recess means, a plurality of electrical contact members disposed in respective ones of said housing compartments and in side-by-side relation and having rigid contact pin portions extending downwardly through and firmly anchored in said lower housing means and projecting perpendicularly downward from the bottom side of said housing in parallel relation to one another, said contact members further having flexible spring contact arm portions extending laterally in side-by-side relation into and exposed within the said upper recess of said upper housing member for spring contact engagement with the said circuit contacts on the terminal board of said chip package, and a clamp member mounted on said upper housing member and engaging and clamping the said chip package in place in said housing upper recess in contact member-engaging position therein with the said circuit contacts pressed against and in electrical contact with the spring contact arm portions of respective ones of said contact members, said clamp member being hingedly mountable at one end on said housing for pivotal movement relative thereto and being provided with catch means at its other end for locking engagement with said housing to hold the said clamp means in a closed position relative thereto with the clamp means engaging and clamping the said package in place in said housing upper recess in the said contact member-engaging position therein, said upper housing member being provided with a pair of pivot bearing recesses and a pair of locking notches both located in an opposite pair of side walls of said upper housing member for respectively receiving pivot trunnions on said clamp member and the said catch means thereon, and the top and outer sides of said upper housing being encased by a metal ground shield and said clamp member comprising a metal frame formed on its opposite sides with the said pivot trunnions and with the said catch means, said ground shield being provided with inturned tongues bent into the said pivot bearing recesses and locking notches in said upper housing member to secure the said ground shield in place thereon.

* * * * *